United States Patent
Lin et al.

(10) Patent No.: US 8,828,848 B2
(45) Date of Patent: Sep. 9, 2014

(54) DIE STRUCTURE AND METHOD OF FABRICATION THEREOF

(75) Inventors: Jing-Cheng Lin, Hsin-Chu (TW); Ying-Da Wang, Taipei (TW); Li-Chung Kuo, Taipei (TW); Szu Wei Lu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/328,746

(22) Filed: Dec. 16, 2011

(65) Prior Publication Data

US 2013/0154062 A1 Jun. 20, 2013

(51) Int. Cl.
*H01L 21/00* (2006.01)

(52) U.S. Cl.
USPC .......... 438/464; 438/460; 438/461; 438/462; 438/463; 438/465; 257/676; 257/782; 257/E21.511

(58) Field of Classification Search
CPC .............................. H01L 23/585; H01L 24/97
USPC .......... 257/620, 618; 438/460, 461, 462, 463, 438/464, 465
See application file for complete search history.

(56) References Cited

U.S. PATENT DOCUMENTS

| | | | |
|---|---|---|---|
| 4,811,082 A | 3/1989 | Jacobs et al. | |
| 4,990,462 A | 2/1991 | Sliwa, Jr. | |
| 5,075,253 A | 12/1991 | Sliwa, Jr. | |
| 5,380,681 A | 1/1995 | Hsu | |
| 5,481,133 A | 1/1996 | Hsu | |
| 6,002,177 A | 12/1999 | Gaynes et al. | |
| 6,187,678 B1 | 2/2001 | Gaynes et al. | |
| 6,229,216 B1 | 5/2001 | Ma et al. | |
| 6,236,115 B1 | 5/2001 | Gaynes et al. | |
| 6,271,059 B1 | 8/2001 | Bertin et al. | |
| 6,271,815 B1 | 8/2001 | Yang et al. | |
| 6,355,501 B1 | 3/2002 | Fung et al. | |
| 6,434,016 B2 | 8/2002 | Zeng et al. | |
| 6,448,661 B1 | 9/2002 | Kim et al. | |
| 6,461,895 B1 | 10/2002 | Liang et al. | |
| 6,562,653 B1 | 5/2003 | Ma et al. | |
| 6,570,248 B1 | 5/2003 | Ahn et al. | |
| 6,600,222 B1 | 7/2003 | Levardo | |
| 6,607,938 B2 | 8/2003 | Kwon et al. | |
| 6,661,085 B2 | 12/2003 | Kellar et al. | |

(Continued)

FOREIGN PATENT DOCUMENTS

CN 101521165 9/2009

*Primary Examiner* — Earl Taylor
*Assistant Examiner* — Samuel Lair
(74) *Attorney, Agent, or Firm* — Slater and Matsil, L.L.P.

(57) ABSTRACT

A die having a ledge along a sidewall, and a method of forming the die, is provided. A method of packaging the die is also provided. A substrate, such as a processed wafer, is diced by forming a first notch having a first width, and then forming a second notch within the first notch such that the second notch has a second width less than the first width. The second notch extends through the substrate, thereby dicing the substrate. The difference in widths between the first width and the second width results in a ledge along the sidewalls of the dice. The dice may be placed on a substrate, e.g., an interposer, and underfill placed between the dice and the substrate. The ledge prevents or reduces the distance the underfill is drawn up between adjacent dice. A molding compound may be formed over the substrate.

21 Claims, 7 Drawing Sheets

(56) References Cited

U.S. PATENT DOCUMENTS

| | | | | |
|---|---|---|---|---|
| 6,762,076 | B2 | 7/2004 | Kim et al. | |
| 6,790,748 | B2 | 9/2004 | Kim et al. | |
| 6,794,273 | B2 * | 9/2004 | Saito et al. | 438/462 |
| 6,887,769 | B2 | 5/2005 | Kellar et al. | |
| 6,908,565 | B2 | 6/2005 | Kim et al. | |
| 6,908,785 | B2 | 6/2005 | Kim et al. | |
| 6,924,551 | B2 | 8/2005 | Rumer et al. | |
| 6,943,067 | B2 | 9/2005 | Greenlaw | |
| 6,975,016 | B2 | 12/2005 | Kellar et al. | |
| 7,037,804 | B2 | 5/2006 | Kellar et al. | |
| 7,087,538 | B2 | 8/2006 | Staines et al. | |
| 7,151,009 | B2 | 12/2006 | Kim et al. | |
| 7,157,787 | B2 | 1/2007 | Kim et al. | |
| 7,215,033 | B2 | 5/2007 | Lee et al. | |
| 7,271,479 | B2 * | 9/2007 | Zhao et al. | 257/704 |
| 7,276,799 | B2 | 10/2007 | Lee et al. | |
| 7,279,795 | B2 | 10/2007 | Periaman et al. | |
| 7,301,222 | B1 * | 11/2007 | Patwardhan et al. | 257/620 |
| 7,307,005 | B2 | 12/2007 | Kobrinsky et al. | |
| 7,317,256 | B2 | 1/2008 | Williams et al. | |
| 7,320,928 | B2 | 1/2008 | Kloster et al. | |
| 7,402,442 | B2 | 7/2008 | Condorelli et al. | |
| 7,410,884 | B2 | 8/2008 | Ramanathan et al. | |
| 7,432,592 | B2 | 10/2008 | Shi et al. | |
| 7,494,845 | B2 | 2/2009 | Hwang et al. | |
| 7,528,494 | B2 | 5/2009 | Furukawa et al. | |
| 7,531,890 | B2 | 5/2009 | Kim | |
| 7,554,180 | B2 * | 6/2009 | McKerreghan et al. | 257/676 |
| 7,557,597 | B2 | 7/2009 | Anderson et al. | |
| 7,576,435 | B2 | 8/2009 | Chao | |
| 7,638,858 | B2 * | 12/2009 | Kurosawa et al. | 257/622 |
| 7,651,889 | B2 * | 1/2010 | Tang et al. | 438/114 |
| 7,834,450 | B2 | 11/2010 | Kang | |
| 8,030,769 | B2 * | 10/2011 | Shin et al. | 257/737 |
| 8,048,781 | B2 * | 11/2011 | How | 438/464 |
| 8,105,875 | B1 * | 1/2012 | Hu et al. | 438/107 |
| 2003/0022465 | A1 * | 1/2003 | Wachtler | 438/462 |
| 2003/0038343 | A1 * | 2/2003 | Hasegawa | 257/620 |
| 2009/0200684 | A1 * | 8/2009 | Masuda et al. | 257/778 |
| 2009/0215227 | A1 | 8/2009 | Tan et al. | |
| 2011/0147898 | A1 * | 6/2011 | Hosier et al. | 257/620 |
| 2013/0009316 | A1 * | 1/2013 | Wang et al. | 257/774 |

\* cited by examiner

DIE STRUCTURE AND METHOD OF FABRICATION THEREOF

BACKGROUND

Semiconductor devices are used in many electronic and other applications. Semiconductor devices comprise integrated circuits that are formed on semiconductor wafers by depositing many types of thin films of material over the semiconductor wafers and patterning the thin films of material to form the integrated circuits. Semiconductor wafers may be diced to form individual dice.

The dice may be mounted on another substrate, such as an interposer. An underfill material is placed between the dice and the other substrate to provide structural support and protect against environmental contaminants. In multi-chip packages, the multiple dice may be placed adjacent to each other. In these situations, capillary forces may draw the underfill material up between the adjacent dices to the surface of the dice. A molding step may be performed to form a molding compound surrounding the individual dice. The molding compound may be partially removed from the top of the die side to expose the upper surface of the dice.

BRIEF DESCRIPTION OF THE DRAWINGS

For a more complete understanding of the present disclosure, and the advantages thereof, reference is now made to the following descriptions taken in conjunction with the accompanying drawings, in which.

DETAILED DESCRIPTION OF ILLUSTRATIVE EMBODIMENTS

The making and using of the embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Embodiments discussed herein are described in a specific context, namely, dicing a processed wafer into individual dice and attaching those individual dice onto another substrate, such as an interposer. These embodiments, however, are provided for illustrative purposes only and aspects of the current disclosure may be used in other embodiments. Furthermore, the processes described herein are simplified and illustrative only and do not limit the embodiments or the scope of the claims, and these examples are presented for explanation and understanding of the embodiments.

Figure 1:
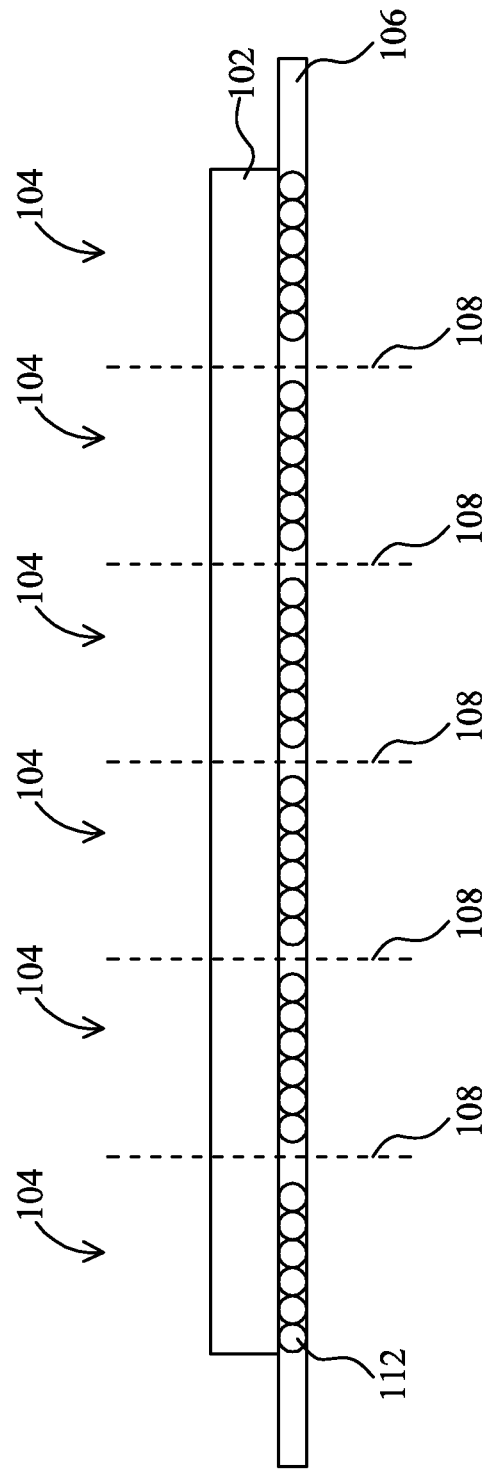
FIGS. 1-7 illustrate various intermediate stages in a manufacture of a semiconductor device.

Referring first to FIG. 1, there is shown a substrate 102 having a plurality of dice regions 104 thereon attached to a carrier tape 106 in accordance with an embodiment. The substrate 102 may comprise, for example, a wafer having electrical circuits (not shown) formed thereon, an interposer (with or without active/passive devices), a mounting substrate, a combination thereof, or the like. The substrate 102 may be a bulk silicon substrate, a semiconductor-on-insulator (SOI) substrate, silicon germanium, germanium, quartz, sapphire, glass and/or the like. In an embodiment, the substrate 102 has an interconnect structure formed thereon. Generally, the interconnect structure includes one or more dielectric layers, conductive layers (e.g., metallization layers), and vias that act to interconnect various electrical devices that may be formed on the substrate 102. The substrate 102 may further include through vias (TVs) to allow electrical interconnections between opposing sides of the substrate 102 and/or between stacked dies.

The substrate 102 illustrates a substrate prior to dicing to form separate dies. In FIG. 1, lines 108 illustrate boundaries, e.g., scribe lines, at which the substrate 102 may be diced, thereby defining the dice regions 104. It should also be noted that five first scribe lines 108 are shown for illustrative purposes only, and that actual devices may have more or less corresponding structures. The dice regions 104 may include any suitable circuitry for a particular application.

As illustrated in FIG. 1, the substrate 102 is mounted on a carrier membrane, such as a carrier tape 106. The substrate 102 is coupled to the carrier tape via first conductive elements 112, which may be formed by lead free solder, eutectic lead, or the like. In an embodiment, the carrier tape 106 has an adhesive surface that is used to attach the substrate 102 to the carrier tape 106 via first conductive elements 112. In other embodiments, the substrate 102 may be attached prior to forming, for example, the first conductive elements 112. Other types of carrier membranes and/or carrier substrates may be used.

Figure 2:
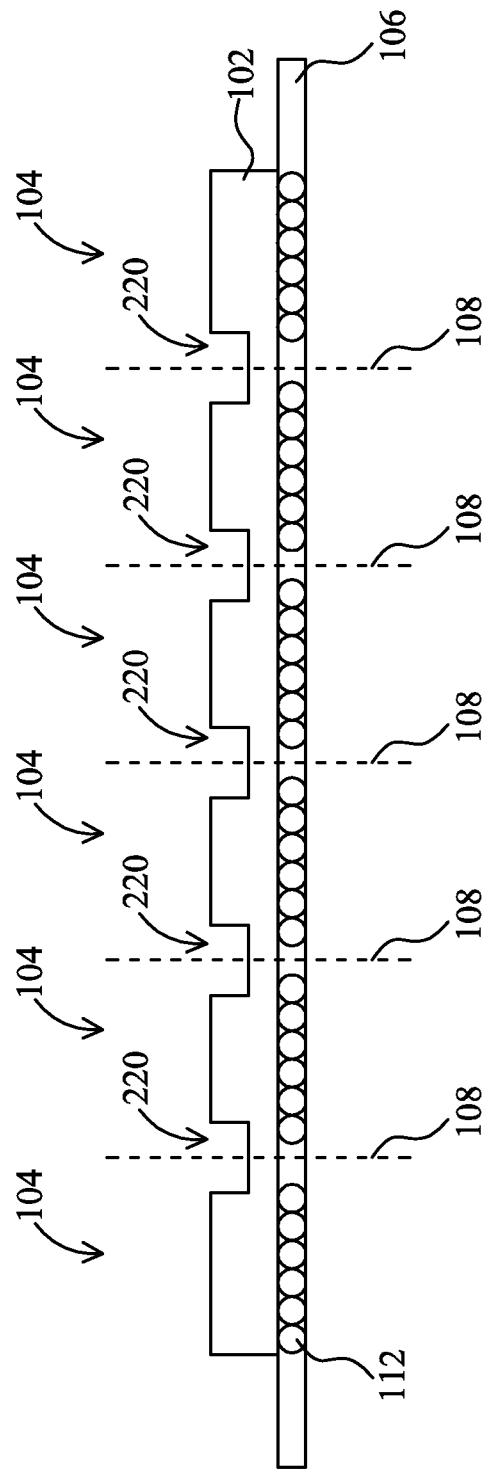

Referring now to FIG. 2, a first notch 220 is formed in the substrate 102 in accordance with an embodiment. In an embodiment, the first notch 220 is formed using a saw, although other techniques may be used to create the first notch 220. For example, in other embodiments a laser, an etching process, or the like may be used to create the first notch 220.

As illustrated in FIG. 2, in an embodiment, the first notch 220 extends partially through the substrate 102. For example, in an embodiment the first notch 220 may have a depth of about 50 μm to about 700 μm for a substrate having a thickness of about 770 μm. In another example, the depth of the first notch 220 may be from about 10% to about 90% of the thickness of the substrate. In an embodiment, the first notch 220 has a width of about 50 μm to about 500 μm. Other widths and depths, smaller or larger, may be used for the first notch 220.

Figure 3:
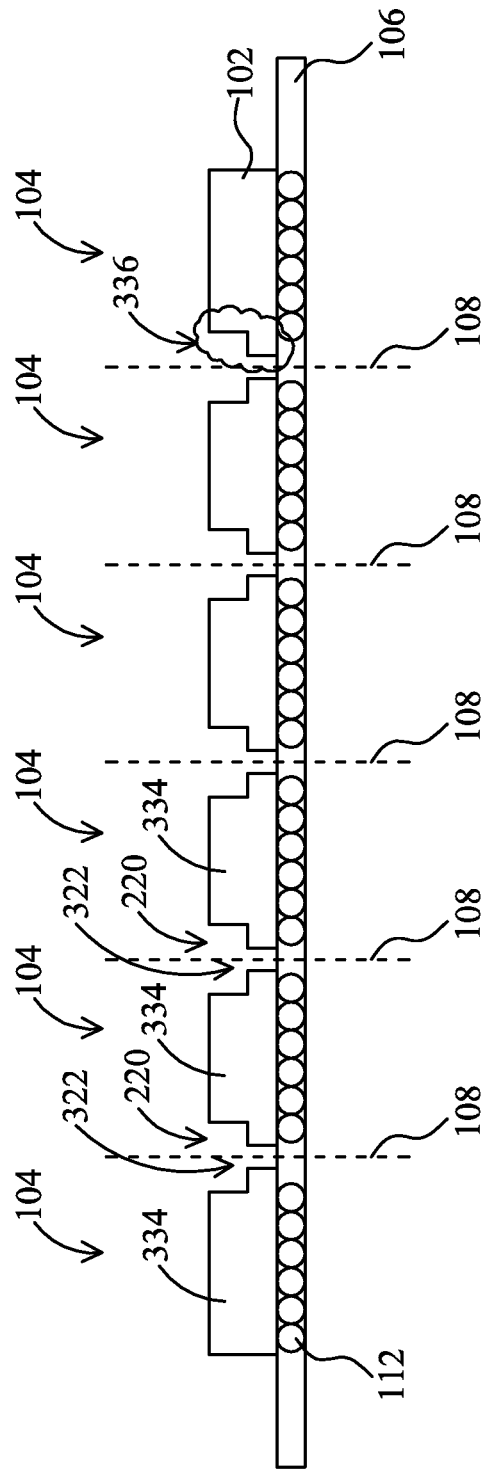

Referring now to FIG. 3, a second notch 322 is formed within the first notch 220 and extending through the remaining portions of the substrate 102. In this manner, a plurality of dicing operations are performed to dice the substrate 102 (see FIGS. 1 and 2) into a plurality of dice 334. In an embodiment, the second notch 322 is formed using a saw, although other techniques may be used to create the second notch 322. For example, in other embodiments a laser, an etching process, or the like may be used to create the second notch 322. In an embodiment, the second notch 322 has a width of about 10 μm to about 50 μm. Other widths and depths, smaller or larger, may be used for the second notch 322.

As illustrated in FIG. 3, in an embodiment, the second notch 322 is narrower than the first notch 220. As will be explained in greater detail below, the dice 334 are placed on a substrate, such as an interposer, and an underfill material will be placed between the dice 334 and the underlying substrate. When forming the underfill material, capillary forces draw the underfill material up between adjacent dice 334, and this underfill material may cause the interposer or other substrate to warp, for example, during the curing process.

By using multiple dicing procedures to create different widths of notches, a ledge 336 is formed along the edges of the dice 334. These ledges may act to limit how far up the edges of the dice 334 that an underfill material may be drawn by capillary forces, which in turn may reduce the warpage of the underlying interposer or other substrate.

In an embodiment, the ledge 336 has a width of about 5 μm to about 200 μm. Other widths, smaller or larger, may be used for the first notch 220. It should also be noted that the distance the underfill travels up sidewalls of the dice may be controlled by depth of the first notch 220. Generally, the deeper the first notch 220, the lower an underfill material will extend. It should also be noted that the size of the ledge 336 may be adjusted according to the characteristics of the underfill material as well as the device structure. For example, if the underfill material is more susceptible to the capillary forces and the spacing between adjacent dice is such that the capillary forces are sufficiently present, then a larger ledge may be desirable.

Figure 4:
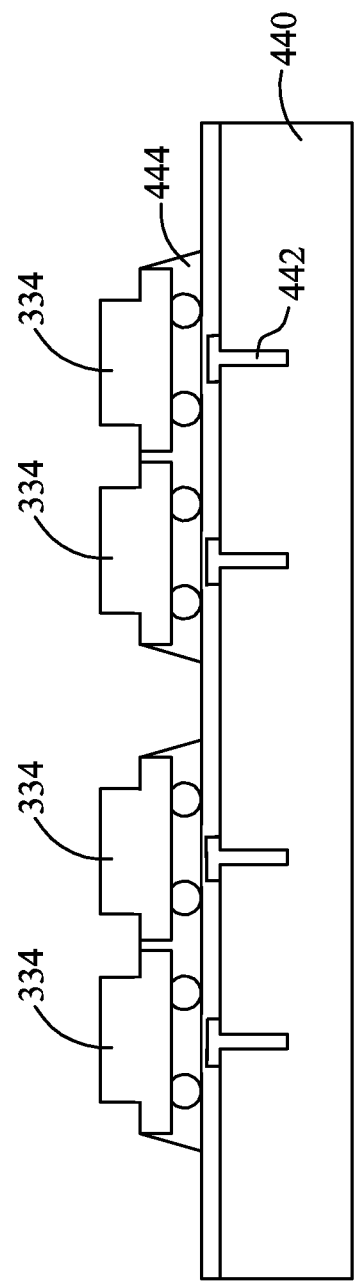

FIG. 4 illustrates the dice 334 after the dice 334 have been placed on a second substrate 440 in accordance with an embodiment. The second substrate 440 may be, for example, an interposer, a processed or unprocessed semiconductor wafer, a packaging substrate, or the like. In an embodiment such as that illustrated in FIG. 4, the second substrate 440 may be a silicon wafer, a semiconductor substrate, glass, ceramic, BT resin, epoxy resin or another substrate material for interposers. In an embodiment, the second substrate 440 may include one or more TVs 442 to provide electrical connections between the dice 334 and electrical connections to be formed on an opposing surface of the second substrate 440, which will be explained in greater detail below. The dice 334 are illustrated as being identical for illustrative purposes only. The second substrate 440 may include any suitable combination of dice, identical dice, different dice, or a combination thereof.

FIG. 4 further illustrates underfill material 444 placed between the dice 334 and the second substrate 440. The underfill material 444 may, for example, comprise a liquid epoxy, deformable gel, silicon rubber, or the like that is dispensed between the dice 334 and the second substrate 440, and then cured to harden. This underfill material 444 is used, among other things, to reduce cracking in the first conductive elements 112 and to protect the joints from contaminants.

It is believed that the ledges 336 formed along the sidewalls of the dice 334 prevent or reduce the capillary forces, thereby reducing the height that the underfill material 444 extends up the sidewalls of the dice 334.

Figure 5:
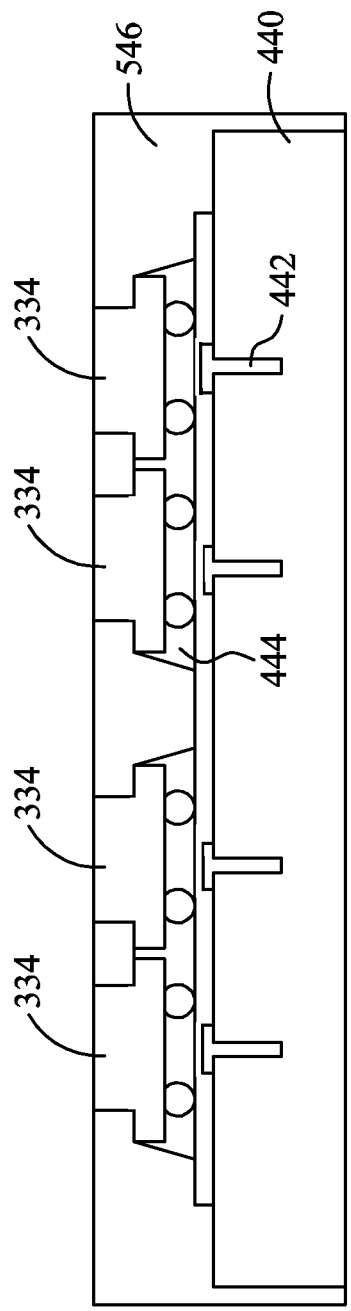

FIG. 5 depicts the assembly following a molding process. An encapsulant or overmold 546 may be formed over the components, e.g., the dice 334, to protect the components from the environment and external contaminants. In the molding operation, a encapsulant compound is formed over the dice 334 and the second substrate 440. In a compression molding process, a liquid type thermoset epoxy resin mold compound may be used in a compress molding machine, the molding compound may be heated to an elevated temperature where it becomes a lower viscous material, and forced under compression into a cavity where the assembly is placed, the encapsulant compound surrounding the dice 334 and the die side of the second substrate 440.

Figure 6:
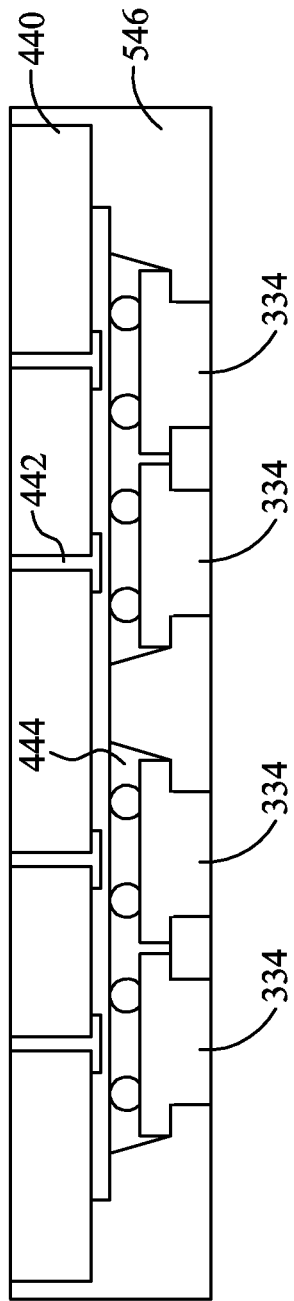

After the encapsulant 546 is cured, the encapsulant 546 may be partially removed in a top grinding operation to expose the upper surfaces of the dice 334 on the die side of the second substrate as illustrated in FIG. 6. The upper surfaces of the dice 334 may be exposed, for example, to aid in heat dissipation. For example, in an embodiment, a heat sink or heat spreader may be attached to the upper surfaces of the dice to aid in cooling the dice 334.

FIG. 6 further illustrates a backside thinning process that may be performed to expose the interconnect, e.g. the TVs 442, extending into the second substrate 440. The backside thinning is performed on a side opposing the dice 334. The thinning may be performed through physical grinding, chemical etching, combinations thereof, or the like, until the interconnect TVs 442 are exposed on the bottom surface of the second substrate 440, as shown in FIG. 6. Following the backside thinning operation, the second substrate 440 may be thinned to a thickness between about 30 microns to about 200 microns, as a non-limiting example. The second substrate 440 may be thinned to as little as 100 microns.

Figure 7:
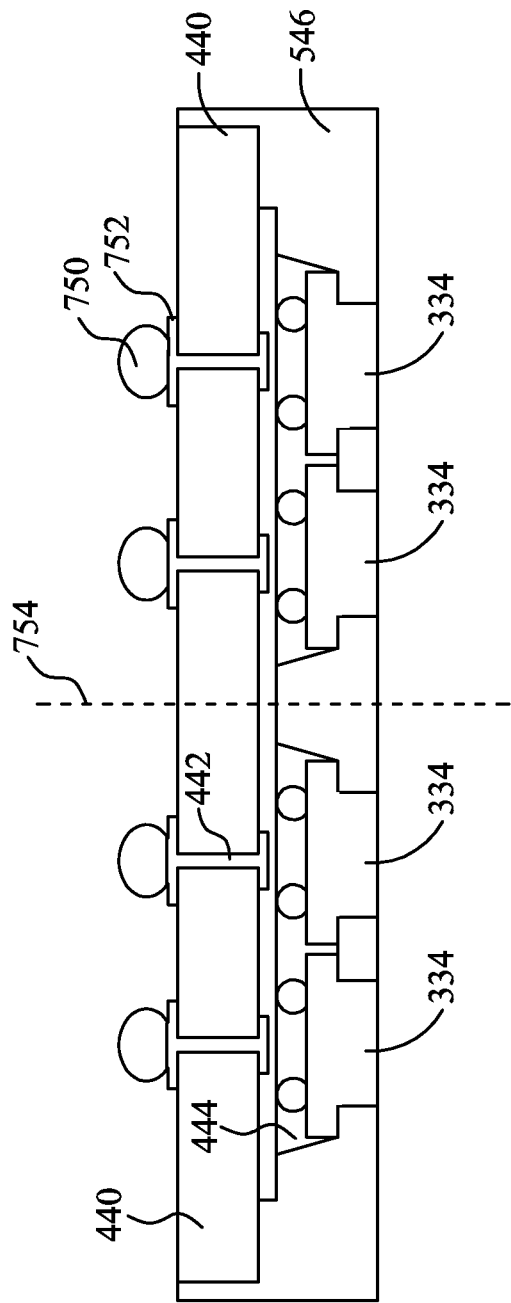

FIG. 7 illustrates electrical connections 750 formed along the backside of the second substrate 440 in accordance with an embodiment. In the embodiment illustrated in FIG. 7, the electrical connections 750 comprise bumping or solder balling formed over contact pads 752, although other types of electrical connections may be utilized. For example, C4 solder bumps or solder balls may be formed on the opposite or connection side of the second substrate 440 to form external or system connections when the second substrate 440 is mounted to a circuit board or card, wafer, packaging substrate, another interposer, or the like. The bottom surface of the second substrate 440 may have a redistribution layer ("RDL") forming connections that run horizontally and map the solder balls to different TVs, to provide flexibility in the solder ball placement. The solder bumps may be a lead based, or lead free solder, and are compatible with solder reflow processes that will be used later to mount the interposer assemblies to a mother board, system board or the like in the target system. The contact pads 752 may have various plating treatments to increase adhesion, provide diffusion barriers, prevent oxidation, and increase solderability, including nickel, gold, platinum, palladium, copper, and their alloys, and including such treatments as electroless nickel immersion gold ("ENIG"), electroless nickel electroless palladium immersion gold ("ENEPIG") and the like.

As one of ordinary skill in the art will realize, the above description provides a general description of the features of the embodiment and that numerous other features may be present. For example, other circuitry, liners, barrier layers, under-bump metallization configurations, redistribution layers (RDL), and the like, may be present. The above description is meant only to provide a context for embodiments discussed herein and is not meant to limit the disclosure or the scope of any claims to those specific embodiments. Any suitable process may be used to form the structures discussed above and will not be discussed in greater detail herein.

Thereafter, other processing steps may be performed as desired. For example, the second substrate 440 may be diced along, for example, along dicing line 754 to form separate multi-die packages.

In an embodiment, a method is provided. The method comprises providing a substrate; forming a first notch between a first region and a second region, the first notch having a first width; and forming a second notch within the first notch, the second notch having a second width less than the first width, thereby forming a ledge, the second notch extending through the substrate, thereby dicing the substrate into separate dice.

In another embodiment, another method is provided. The method comprises placing a plurality of dice on a substrate, at least one of the dice having a ledge formed along a sidewall; placing an underfill between the plurality of dice and the substrate, the underfill extending between adjacent ones of the plurality of dice; and placing a molding compound over the underfill between the adjacent ones of the plurality of dice.

In yet another method, a device is provided. The device comprises a substrate; a plurality of dice on the substrate, at least a first die of the plurality of dice having a ledge along a sidewall; an underfill between the plurality of dice and the substrate; and a molding compound between adjacent ones of the plurality of dice, the underfill extending between the molding compound and the substrate between the adjacent ones of the plurality of dice.

Having thus described the present disclosure by reference to certain of its embodiments, it is noted that the embodiments disclosed are illustrative rather than limiting in nature and that a wide range of variations, modifications, changes, and substitutions are contemplated in the foregoing disclosure and, in some instances, some features of the present disclosure may be employed without a corresponding use of the other features. Many such variations and modifications may be considered obvious and desirable by those skilled in the art based upon a review of the foregoing description of embodiments. Accordingly, it is appropriate that the appended claims be construed broadly and in a manner consistent with the scope of the disclosure.

Although the present disclosure and its advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method comprising:
   providing a substrate;
   forming a first notch between a first region and a second region, the first notch having a first width;
   after forming the first notch, forming a second notch within the first notch, the second notch having a second width less than the first width, thereby forming a ledge, a surface of the ledge being a bottom surface of the first notch, the second notch extending through the substrate, thereby dicing the substrate into separate dice, the forming the second notch removing material;
   placing one or more of the separate dice onto a second substrate such that the surface of the ledge faces away from the second substrate; and
   after the placing one or more of the separate dice onto the second substrate, placing an underfill between the one or more of the dice and the second substrate, an upper surface of the underfill being at the ledge.

2. The method of claim 1, further comprising placing the substrate on a carrier tape prior to forming the second notch.

3. The method of claim 2, wherein the substrate is attached to the carrier tape via conductive bumps.

4. The method of claim 1, wherein the second substrate comprises an interposer.

5. The method of claim 1, further comprising forming a molding compound over the underfill between adjacent dice.

6. The method of claim 5, further comprising thinning the molding compound.

7. The method of claim 1, wherein the ledge has a width of about 5 μm to about 200 μm.

8. A method comprising:
   placing a plurality of separate dice on a substrate, at least one of the dice having a ledge formed along a sidewall, a surface of the ledge extending from a sidewall of a narrow section to a sidewall of a wide section, the surface of the ledge facing away from the substrate;
   after the placing the plurality of separate dice on the substrate, placing an underfill between the plurality of separate dice and the substrate, the underfill extending between adjacent ones of the plurality of separate dice, the underfill extending along sidewalls of the plurality of separate dice, the underfill not extending above the ledge; and
   placing a molding compound over the underfill between the adjacent ones of the plurality of separate dice.

9. The method of claim 8, further comprising separating the substrate into multiple components, at least one of the multiple components having a two or more dice.

10. The method of claim 8, wherein the ledge has a width of about 5 μm to about 200 μm.

11. The method of claim 8, further comprising thinning the molding compound, thereby exposing at least one of the plurality of separate dice.

12. A method comprising:
    providing one or more first substrates;
    forming notches between adjacent die regions on the one or more substrates;
    singulating the die regions within the notches, thereby forming a plurality of separate dice, at least one of the dice having a ledge formed along a sidewall, a surface of the ledge extending from a sidewall of a narrow section to a sidewall of a wide section,
    placing the plurality of separate dice on a second substrate, the surface of the ledge facing away from the second substrate;
    after the placing the plurality of separate dice on the second substrate, placing an underfill between the plurality of separate dice and the second substrate, the underfill extending between adjacent ones of the plurality of separate dice, the underfill extending along sidewalls of the plurality of separate dice, the underfill not extending above the ledge; and
    placing a molding compound over the underfill between the adjacent ones of the plurality of separate dice.

13. The method of claim 12, further comprising placing the first substrates on carrier tape prior to the singulating.

14. The method of claim 13, wherein the first substrates are attached to the carrier tape via conductive bumps.

15. The method of claim 12, wherein the second substrate comprises an interposer.

16. The method of claim 12, wherein the ledge has a width of about 5 μm to about 200 μm.

17. The method of claim 12, further comprising separating the second substrate into a plurality of multi-die packages.

18. The method of claim 12, wherein the forming notches is performed at least in part by sawing.

19. The method of claim 12, wherein the singulating is performed at least in part by sawing, wherein the sawing has a cut line narrower than a width of the notches.

20. The method of claim 12, further comprising thinning the molding compound.

21. The method of claim 20, wherein the thinning exposes at least one of the plurality of separate dice.

* * * * *